United States Patent
Smirnov et al.

(10) Patent No.: US 6,274,007 B1
(45) Date of Patent: Aug. 14, 2001

(54) METHODS OF FORMATION OF A SILICON NANOSTRUCTURE, A SILICON QUANTUM WIRE ARRAY AND DEVICES BASED THEREON

(75) Inventors: Valery K Smirnov; Dmitri S Kibalov, both of Yaroslavl (RU)

(73) Assignee: Sceptre Electronics Limited, St. Helier, NJ (US)

( * ) Notice: Subject to any disclaimer, the term of this patent is extended or adjusted under 35 U.S.C. 154(b) by 0 days.

(21) Appl. No.: 09/525,722

(22) Filed: Mar. 14, 2000

(30) Foreign Application Priority Data

Nov. 25, 1999 (RU) .................................... 99124768

(51) Int. Cl.[7] .................................................. C23C 14/34
(52) U.S. Cl. ................................ 204/192.13; 204/192.23
(58) Field of Search ........................ 204/192.13, 192.23; 427/8, 299, 372.2

(56) References Cited

FOREIGN PATENT DOCUMENTS

99/17346   4/1999  (WO) .

OTHER PUBLICATIONS

Ishikawa et al., "Fabrication of [110]-aligned Si quantum wires embedded in $SiO_2$ by low-energy oxygen implanation", Nuclear Instruments & Methods in Physics Research, B, 1999, v.147, pp. 304–309.

Smirnov et al., "Wave–ordered structures formed on SOI wafers by reactive ion beams", Nuclear Instruments and Methods in Physics Research, 1999, v. 147, pp. 310–315, Elsevier Science Ltd.

Smirnov et al., "Nanoscale wave-ordered structures on SOI", Proceedings of the NATO Advanced research Workshop, 1999, Elsevier Science Ltd.

Bachurin et al., "Formation of Thin Silicon Nitride Layers on Si by Low Energy $N_2+$ Ion Bomardment", Nuclear Instruments & Methods in Physics Research B, 1999, v. 147, pp. 316–319, Elsevier Science Ltd.

Leobandung et al., "Observation of quantum effects and Coulomb blockade in silicon quantum–dot transistors at temperature over 100K", Applied Physics Letters, v. 67, No. 7, 1995, pp. 938–940.

Colinge et al., "A Silicon–on–Insulator Quantum Wire", Solid–State Electronics, vol. 39, No. 1, 1996, pp. 49–51, Elsevier Science Ltd 1996.

*Primary Examiner*—Nam Nguyen
*Assistant Examiner*—Steven H. VerSteeg
(74) *Attorney, Agent, or Firm*—Ratner & Prestia

(57) ABSTRACT

A process for controllably forming silicon nanostructures such as a silicon quantum wire array. A silicon surface is sputtered by a uniform flow of nitrogen molecular ions in an ultrahigh vacuum so as to form a periodic wave-like relief in which the troughs of said relief are level with the silicon-insulator border of the SOI material. The ion energy, the ion incidence angle to the surface of said material, the temperature of the silicon layer, the formation depth of the wave-like relief, the height of said wave-like relief and the ion penetration range into silicon are all determined on the basis of a selected wavelength of the wave-like relief in the range 9 nm to 120 nm. A silicon nitride mask having pendant edges is used to define the area of the silicon surface on which the array is formed. Impurities are removed from the silicon surface within the mask window prior to sputtering. For the purpose of forming a silicon quantum wire array, the thickness of the SOI silicon layer is selected to be greater than the sum of said formation depth, said height and said ion penetration range, the fabrication of the silicon wires being controlled by a threshold value of a secondary ion emission signal from the SOI insulator. The nanostructure may be employed in optoelectronic and nanoelectonic devices such as a FET.

9 Claims, 2 Drawing Sheets

US 6,274,007 B1

METHODS OF FORMATION OF A SILICON NANOSTRUCTURE, A SILICON QUANTUM WIRE ARRAY AND DEVICES BASED THEREON

The invention relates to methods of forming quasi-one-dimensional solid-state silicon nanostructures. Such nanostructures may form the basis for nanoscale electronic and optoelectronic fabrication techniques, particularly but not exclusively of silicon quantum wire arrays, and can be used to fabricate silicon-based optoelectronic and nanoelectronic devices.

More particularly, the invention concerns forming silicon quantum wires by ion irradiation and, more specifically, to a process of sputtering a high-purity surface of silicon-on-insulator (SOI) material by a uniform flow of nitrogen molecular ions, so as to form a wave-like relief providing an array of nanoscale silicon "quantum wires". The quantum wire array can be used as a light source in optoelectronic devices through the array conduction or in nanoelectronic devices; e.g. as a channel in a field effect transistor (FET).

A known method for forming silicon quantum wires with a cross-section of 10×15 nm$^2$ embedded in silicon oxide uses low-energy ion implantation of oxygen into silicon, electron-beam lithography and wet chemical etching, followed by high-temperature annealing in an inert environment. This results in the formation of silicon quantum wires embedded in silicon oxide at the bottom centre of V-grooves (Y. Ishikawa, N. Shibata, F. Fukatsu "Fabrication of [110]-aligned Si quantum wires embedded in SiO$_2$ by low-energy oxygen implantation" Nuclear Instruments and Methods in Physics Research, B, 1999, v. 147, pp. 304–309, Elsevier Science Ltd.) [Ref1].

There are several disadvantages to this known method. The use of electron-beam lithography and wet chemical etching when forming V-grooves on the silicon surface both limit the element density of the structure and reduce the wire yield. The absence of in situ control of the process further reduces the wire yield. The small wire density prevents the wires being useful for nanoelectronic devices of the type in which the interaction of charged particles in the neighbouring wires is important.

Previously published work, of which the present inventors were among the joint authors, discloses a method of forming wave-ordered-structures (WOS) on silicon, and in particular on SOI. The method comprises the steps of sputtering the SOI silicon layer by a nitrogen molecular ion probe scanned in a raster pattern in an ultra-high vacuum so as to form a periodical, wave-like nanoscale relief (WOS). The "wave front" of the nanoscale relief is in the direction of the ion incidence. The method includes detecting a secondary ion emission signal from the SOI insulator and terminating sputtering when this signal reaches a predetermined value. This reference also discloses the dependence of WOS formation upon the ion energy, E, the ion incidence angle, θ, relative to the surface normal, and the temperature, T, of the SOI sample. The work also identifies a characteristic of the relief formation process, namely the sputtering depth $D_m$ corresponding to the onset of intense growth of a WOS and discusses the dependency of $D_m$ upon E, θ, T, and the WOS wavelength λ. The work further indicates that the SOI silicon thickness $D_B$ should not be less than the sputtering depth at which a stable WOS is formed with the desired wavelength (this depth being equal to the relief formation depth referred to hereinafter as $D_F$). (V. K. Smirnov, D. S. Kibalov, S. A. Krivelevich, P. A. Lepshin, E. V. Potapov, R. A. Yankov, W. Skorupa, V. V. Makarov, A. B. Danilin "Wave-ordered structures formed on SOI wafers by reactive ion beams"—Nuclear Instruments and Methods in Physics Research B, 1999, v. 147, pp. 310–315, Elsevier Science Ltd.) [Ref2].

Further work involving one of the present inventors discloses a process of annealing material of the type disclosed in Ref2 in an inert environment at a temperature of 1000° C. for one hour and the resulting internal structure of a WOS at the silicon-insulator interface of the SOI material. (V. K. Smirnov, A. B. Danilin; "Nanoscale wave-ordered structures on SOI"—Proceedings of the NATO Advanced Research Workshop "Perspective, science and technologies for novel silicon on insulator devices"/Ed By P. I. F. Hemment, 1999, Elsevier Science Ltd.) [Ref3].

Further work involving one of the present inventors discloses the dependencies of silicon nitride (Si$_3$N$_4$) layer thickness, $D_N$, on the ion energy E, ion incidence angle to the surface and high-temperature annealing (900–1100° C. for one hour). The annealing has no effect on $D_N$ but maximises the Si/Si$_3$N$_4$ interface sharpness. As shown therein, $D_N$ is equal to the ion penetration range into silicon, R, which is shown to be a linear function of E for the same energy range as that used for WOS formation. On the basis of data disclosed in this reference, the dependence of R on E can be expressed as:

$$R(nm)=1.5E(keV)+4. \qquad (1)$$

(V. I. Bachurin, A. B. Churilov, E. V. Potapov, V. K. Smirnov, V. V. Makarov and A. B. Danilin; "Formation of Thin Silicon Nitride Layers on Si by Low Energy N$_2^+$ Ion Bomardment"—Nuclear Instruments and Methods in Physics Research B, 1999, v. 147, pp. 316–319, Elsevier Science Ltd.) [Ref4].

The above mentioned references Ref2, Ref3 and Ref4 in combination disclose a basic method for the formation of a silicon quantum wire array. The principal advantage of using a silicon quantum wire array, as compared with the use of separated wires, in nanoelectronic and optoelectronic devices lies firstly in the increase of device yield and enhancement of the signal-to-noise ratio of the current characteristics, and also in providing the potential for new capabilities in array-based devices due to the interaction of charged particles in neighbouring quantum wires.

There are a number of disadvantages associated with the basic method as disclosed in Ref2, Ref3 and Ref4. Ref2 does not address the question of whether the WOS wavelength λ changes as the sputtering depth increases from $D_m$ to $D_F$ or whether there is any inter-relationship between $D_m$ and $D_F$. The present invention recognises that the characteristics of the process should be related to the final WOS structure as developed at the depth $D_F$ rather than to the depth $D_m$ as discussed in Ref2. In addition, Ref2 does not address the question of whether there are limits of the domain in the (E, θ) plane in which WOS formation takes place.

Such limitations in the work disclosed in Ref2, Ref3 and Ref4 mean that the required thickness of the SOI silicon layer cannot generally be predetermined from the relationships between the various parameters as discussed in these references. In addition, the essential parameters for controlling the sputtering process (ion energy E, ion incidence angle θ and SOI temperature T) cannot be predetermined. Further, for the isolation of neighbouring silicon wires in the WOS formed in SOI, it is important to ensure the troughs of the WOS relief coincide accurately with the border between the SOI silicon layer and the SOI insulator layer. Ref2 discloses that the secondary ion emission signal may be employed as a basis for terminating the sputtering process, but does not disclose any way of pre-determining a value of the signal which corresponds to isolation of the silicon wires.

That is, the previously published work does not disclose a general method allowing a WOS to be formed reliably such that the troughs of the WOS coincide with the SOI silicon-insulator border so as to form an array of isolated silicon wires.

In addition, for practical purposes in applying such a process by integration with silicon-based nanoelectronic and optoelectronic technology, it is necessary to ensure the formation of the nanostructure array on a specified microarea of the surface in order to obtain a useful structure, for example, in the form of two isolated silicon pads connected by the array.

However, the previously published work does not address such issues as whether techniques such as lithography may be used for this purpose or, if so, what masking layers, if any, might be used.

The present inventors have also determined that the WOS formation process is highly sensitive to the presence of impurities on the SOI surface, particularly the presence of silicon oxide, which degrades the flatness of the WOS relief. As is well known, a thin layer of natural silicon oxide is always present on the surface of silicon exposed to air.

All of the abovementioned disadvantages are related in one way or another to the controllability of the WOS formation process for practical purposes.

Nanoelectronic devices are known containing silicon pads connected by a silicon channel with a 20-nm diameter (a so-called "quantum dot"), a 40-nm thick insulator layer covering the surface of the pads and the channel, and an electrode positioned on the surface of the insulator layer. The silicon contact pads and the channel are formed in the silicon layer of SOI material (E. Leobandung, L. Guo, Y. Wang, S. Chou "Observation of quantum effects and Coulomb blockade in silicon quantum-dot transistors at temperature over 100K" Applied Physics Letters, v. 67, No. 7, 1995, pp. 938–940, American Institute of Physics, 1995) [Ref5].

The disadvantages of this known device lie in the absence of a channel array and in a low device yield because the small dimensions of the devices approach the limits of micro-lithography techniques; i.e. there is low repeatability of the operational results.

There is also another device, a quantum-wire-based FET containing silicon pads connected by seven silicon linear channels with a 86×100 nm$^2$ rectangular section. The silicon channels are covered with a 30-nm thick silicon oxide layer. An electrode gate is positioned above the group of these channels. This device is made using SOI material (J. P. Colinge, X. Baie, V. Bayot, E. Grivei "A silicon-On-Insulator Quantum Wire"—Solid-State Electronics, Vol. 39, No. 1, 1996, pp. 49–51, Elsevier Science Ltd 1996) [Ref6].

The disadvantage of this known device lies in the impossibility of forming silicon channels at a distance equal to the size of the channel because of the limitations of the known lithography methods used for the fabrication of the device.

The various references cited above show how it is possible to fabricate a silicon quantum wire array in particular experimental cases. However, none addresses the problem of how to generalise particular experimental processes so that the quantum wires can be made with predetermined dimensions or how to exercise effective process control. In addition, there is a need for integrating the silicon quantum wire array into useful devices; e.g. so as to form a channel array in an FET.

In accordance with a first aspect of the invention, there is provided a method of forming a silicon nanostructure, comprising:

sputtering a silicon surface by a uniform flow of nitrogen molecular ions in an ultra-high vacuum so as to form a periodic wave-like relief, the wave front of said relief being in the direction of the ion incidence plane; further including the following steps:

prior to sputtering:

selecting a desired wavelength of the periodic wave-like relief in the range 9 nm to 120 nm;

determining the ion energy, the ion incidence angle to the surface of said material, the temperature of said silicon, the formation depth of said wave-like relief, the height of said wave-like relief and the ion penetration range into silicon, all on the basis of said selected wavelength.

Preferably, said ion energy, said ion incidence angle, said temperature of said silicon, said formation depth and said height of said wave-like relief are determined on the basis of previously obtained empirical data relating said ion energy, said ion incidence angle, said temperature of said silicon, said formation depth and said height of said wave-like relief to the wavelength of said periodic wave-like relief, and wherein said ion penetration range is determined from said ion energy.

Preferably, the method further includes the step, prior to sputtering, of positioning a silicon nitride mask containing a window with pendant edges on said silicon surface over the sputter area, and sputtering said silicon surface through said window.

Preferably, the method further includes the step, prior to sputtering, of removing any impurities from the surface of the said silicon layer on which said wave-like relief is to be formed.

Preferably, the method further includes, subsequent to sputtering:

annealing the material with said relief in an inert environment. Preferably, the material is annealed at a temperature between 1000 and 1200° C. for a period of at least one hour.

In preferred embodiments of the invention, said silicon nanostructure comprises a silicon quantum wire array and said silicon comprises a silicon layer of a silicon-on-insulator material, the method further including:

selecting the thickness of said silicon layer to be greater than the sum of said formation depth of said wave-like relief, said height of said wave-like relief, and said ion penetration range.

Preferably, the method further includes:

during sputtering:

detecting a secondary ion emission signal from the insulator layer of said silicon-on-insulator material; and terminating sputtering when the value of the detected signal reaches a predetermined threshold value;

Preferably, said threshold value of said secondary ion emission signal is that value at which the signal exceeds an average background value by an amount equal to the peak-to-peak height of a noise component of the signal.

In accordance with further aspects of the invention, there are provided optoelectronic and electronic devices including quantum wire arrays formed by the method of the first aspect of the invention, such as a device comprising silicon pads connected by said silicon quantum wire array, an insulator layer positioned on said quantum wire array, and an electrode positioned on said insulator.

Apparatus for implementing the method consists of an ultra-high vacuum chamber, a sample introduction attachment, an ion microbeam column with adjustable ion energy and ion probe position on the sample surface, an electron gun, a sample holder with positioning, tilting and rotation functions and means for varying and controlling the sample temperature, a secondary electron detector, and a secondary ion mass analyzer. Suitable apparatus is known in the prior art as a multi-technique surface analysis high capability instrument.

The invention overcomes the disadvantages of the prior art by providing controllability of the process on the basis of a single parameter, namely the desired array period (wavelength), which governs all of the relevant parameters of the process.

Embodiments of the invention will now be described, by way of example only, with reference to the accompanying drawings in which.

Figures 1A, 1B:
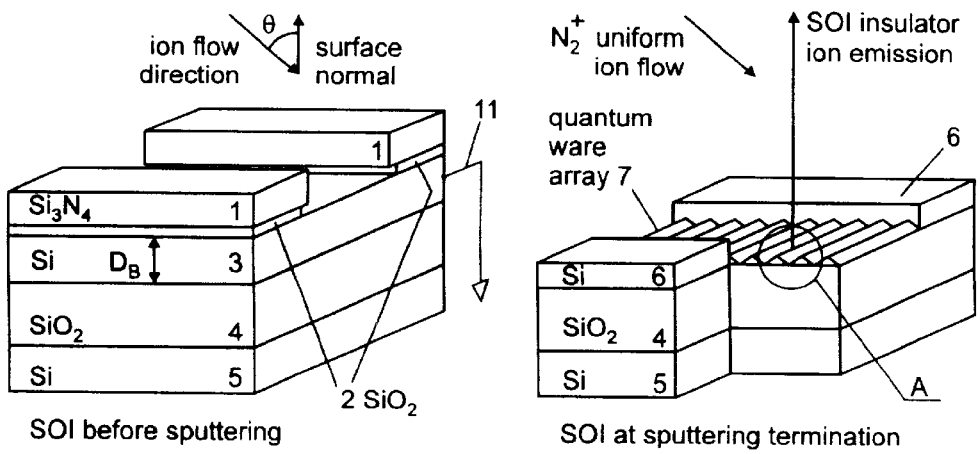
FIG. 1A is a schematic perspective view of an initial SOI structure, including a silicon nitride mask, for use in accordance with the present invention.
FIG. 1B is a schematic perspective view of a final SOI structure after application of the method in accordance with the present invention to the initial structure of FIG. 1A.

Referring now to the drawings, FIG. 1A shows an example of an initial SOI structure for use in accordance with the invention, comprising a silicon substrate 5, a silicon oxide insulating layer 4, a silicon layer 3, in which the quantum wires are to be formed, a thin silicon oxide layer 2 formed on top of the silicon layer 3 and a silicon nitride masking layer 1 formed on top of the thin silicon oxide layer 2. FIG. 1B shows the structure after sputtering in accordance with the invention, comprising the silicon substrate 5 and silicon oxide insulating layer 4 as in FIG. 1A, and in which the silicon layer 3 of FIG. 1A has been modified by the sputtering to leave a silicon layer 6 in the areas masked by the masking layer 1 of FIG. 1A and a silicon nanostructure array 7 formed by the sputtering process in the area left exposed by the masking layer 1. Arrows indicate the direction of $N_2^+$ ion flow during sputtering.

The basic sputtering process for forming a WOS is described in Ref2. As described therein, a focused ion beam is raster-scanned across the surface of the SOI material.

Figure 1C:
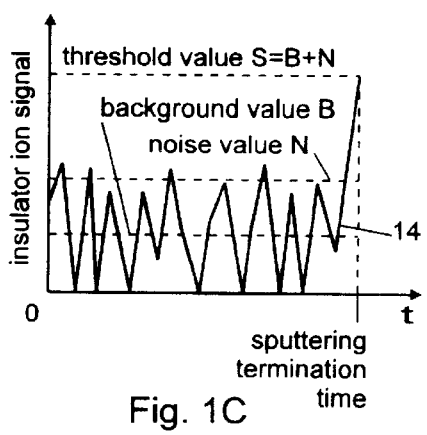
FIG. 1C is a graph illustrating the manner in which a secondary ion emission signal is employed in controlling the method in accordance with the present invention.
Figure 1D:
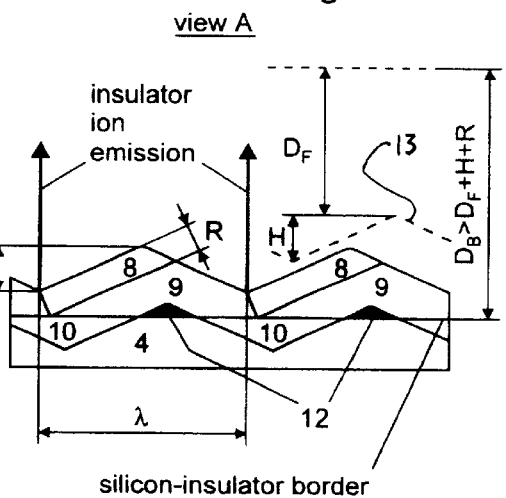
FIG. 1D is a cross sectional view, greatly enlarged, of a portion of the sputtered structure of FIG. 1B (detail A of FIG. 1B)

FIG. 1D illustrates an example of the cross-section of the silicon nanostructure array formed by a sputtering process in accordance with the present invention, which contains regions of amorphous silicon nitride 8, regions of a mixture of amorphous silicon and silicon nitride 9, regions of silicon oxynitride 10, and regions of crystal silicon 12.

The following parameters relating to the SOI material, the WOS structure and the WOS formation process are referred to herein, as illustrated in FIG. 1:

$D_B$ is the initial thickness of the silicon layer 3 of the SOI material.

$D_F$ is the relief formation depth (i.e. the minimum depth of material removed by sputtering from the original surface of the silicon layer 3 to the crests of the waves of the WOS in order to obtain a stable WOS, the "sputtering depth" being the vertical distance from the original silicon surface to the top of the WOS).

H is the height of the stabilised WOS relief; i.e. the vertical distance between the wave crest and the nearest wave trough (double the wave amplitude).

R is the ion penetration range into silicon for a given ion energy.

The present invention is particularly concerned with controlling the sputtering process in order to allow the required silicon nanostructure to be formed reliably with predetermined parameters. Further investigation of the WOS formation process by the present inventors has led to the following conclusions:

(a) The WOS wavelength λ remains constant from the initial onset of the formation of the WOS at sputtering depth $D_m$ through to the stabilisation of the WOS structure at sputtering depth $D_F$ (the relief formation depth) and thereafter under continued sputtering up to depths several times the value of $D_F$.

(b) The relief height increases linearly with time from the depth $D_m$ to the depth $D_F$, reaching the value H at depth $D_F$ and remaining constant thereafter under continued sputtering. That is, the shape and dimensions of the WOS remain substantially constant under continued sputtering beyond $D_F$, however the position of the WOS on the SOI material migrates in a direction opposite to the direction of ion incidence (the broken line 13 in FIG. 1D illustrates the position of the WOS at the time when the sputtering depth equals $D_F$, whilst the main drawing indicates the structure at a later time after sputtering has been terminated).

(c) $D_F$ is related to $D_m$ by the formula:

$$D_F = 1.5 D_m.$$

(d) $D_F$ is related to the WOS wavelength λ by the formula:

$$D_F(nm) = 1.316(\lambda(nm) - 9) \quad (2)$$

for λ in the range 9 nm to 120 nm.

(e) H is proportional to λ, this proportionality varying with the angle of incidence of the ion beam, θ; e.g.

$$H = 0.26\lambda \text{ for } \theta = 41°$$
$$H = 0.25\lambda \text{ for } \theta = 43°$$
$$H = 0.23\lambda \text{ for } \theta = 45°$$
$$H = 0.22\lambda \text{ for } \theta = 55°$$
$$H = 0.22\lambda \text{ for } \theta = 58°. \quad (3)$$

(f) The behaviour of the "true" secondary electron emission from the ion sputtered area of the silicon surface reflects the appearance of the WOS at the sputtering depth $D_m$ and the formation of the stabilised WOS at the sputtering depth $D_F$. The onset of the emission increase corresponds to the depth $D_m$. The onset of emission saturation corresponds to the sputtering depth $D_F$.

Figure 1E:
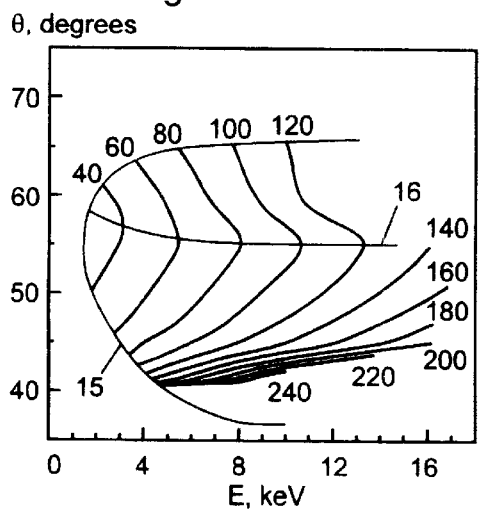
FIG. 1E is a graph showing the relationship between ion incidence angle, ion energy and the wavelength of a WOS formed in accordance with the present invention.
Figure 1F:
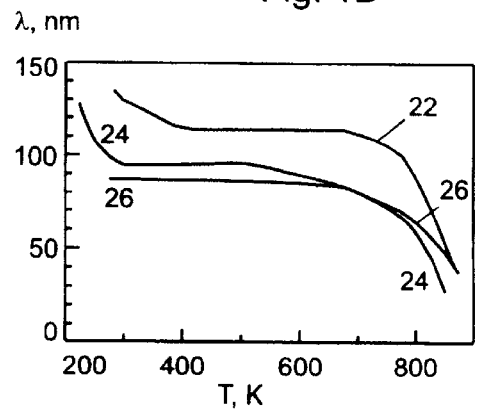
FIG. 1F is a graph showing the manner in which the wavelength of a WOS formed in accordance with the present invention varies with the temperature of the SOI material for different ion energies.

Investigations were also conducted to determine the manner in which λ depends on the ion beam energy E, the ion beam incidence angle θ and the temperature of the SOI material, T (or, more specifically, the temperature of the SOI silicon layer). FIG. 1E illustrates data showing how λ varies with E and θ at room temperature. The curve 15 defines the limit of the domain in which WOS formation takes place. The curves 15, 16 and 120 limit the part of the WOS domain in which the wave-like relief has a more coherent structure with a linear relationship between λ and $D_F$ according to the formula (2). FIG. 1F illustrates how λ varies with T for different values of E and θ. Curve 22 corresponds to E=9 keV, θ=45°. Curve 24 corresponds to E=5 keV, θ=45°. Curve 26 corresponds to E=9 keV, θ=55°.

From these data, it can be seen that, at room temperature, λ can vary within a useful range of values from 30 nm to 120 nm. Varying the temperature of the sample from room temperature to 550 K has no significant effect. Heating the sample from 550 K up to 850 K reduces the value of λ by a factor of 3.3 as compared with the equivalent value at room temperature.

The inventors have further determined that the depth $D_B$ of the silicon layer 3 of the SOI material required for a given WOS can be expressed by the formula:

$$D_B > D_F + H + R \quad (4)$$

It will be noted that a depth $D_B = D_F + H$ is sufficient for a stable WOS to be formed. However, the present inventors have discovered that it is important for the ion penetration range R to be taken into account when calculating the minimum depth $D_B$ in order to ensure the reliable formation of mutually isolated quantum silicon wires by the sputtering process and/or subsequent high temperature annealing of the sputtered product.

The inventors' investigations also confirmed that the secondary emission of ions from the SOI insulator begins when the troughs of the WOS reach a distance of about R from the silicon-insulator border of the SOI material (this effect of prior detection of a buried border being previously known in the field of sputter depth profiling).

These observations provide the basis for controlling the formation of the desired silicon nanostructures on the basis of a predetermined value of the WOS wavelength λ.

The data illustrated in FIG. 1E allow values of E and θ to be determined for a desired value of λ in the range from 30 nm to 120 nm at room temperature, 30 nm being the minimum λ obtainable at room temperature (with E=2 keV and θ=58°). Smaller values of λ can be obtained by heating the SOI material above 550K, as shown in FIG. 1F.

Accordingly, for a selected value of λ, suitable values of E, θ and T can be determined. The ion penetration range and the formation depth $D_F$ can be calculated from formulae (1) and (2) and from empirical data (3), and the required depth $D_F$ of the SOI silicon layer can then be calculated from formula (4).

For example, if it is desired to fabricate a silicon quantum wire array with a wire period (λ) of 30 nm, from FIG. 1E it can be determined (by extrapolation) that for λ=30 nm, E=2 keV and θ=58°. From these values, it can be determined that R=7 nm, H=6.6 nm, $D_F$=27.6 nm, and therefore $D_B$=41.2 nm.

In a further example, if it is desired to fabricate a silicon quantum wire array with a wire period (λ) of 9 nm, the sample should be heated to obtain 3.3 fold decrease in λ, so that λ=9 nm at 850 K corresponds to λ=30 nm at room temperature. From FIG. 1E it can be determined (by extrapolation) that for λ=9 nm at 850 K, E=2 keV and θ=58°. From these values, it can be determined that R=7 nm, H=1.98 nm, $D_F$=0 nm, and therefore $D_B$=8.98 nm.

In a further example, if it is desired to fabricate a silicon quantum wire array with a wire period (λ) of 120 nm, from FIG. 1E it can be determined that for λ=120 nm, E=8 keV and θ=45°. From these values, it can be determined that R=16 nm, H=27.6 nm, $D_F$=146 nm, and therefore $D_B$=189.6 nm. Alternative parameters can be determined for the same λ; e.g. for λ=120 nm, E=5.5 keV and θ=43°. From these values, it can be determined that R=12.25 nm, H=30 nm, $D_F$=146 nm, and therefore $D_B$=188.3 nm.

Thus, on the basis of a desired period of the quantum wire array λ in the range 9 nm to 120 nm, the parameters that control the process can be predetermined as shown above.

A wide variety of SOI materials can be used for the process; e.g. SOI obtained by SIMOX (Separation by IMplanted OXygen) technology can be used with the required thickness of silicon layer. Other alternatives will be apparent to those skilled in the art, such as SOI prepared with Smart Cut technology, or monocrystalline films of silicon on either quartz or glass wafers.

FIG. 1 relates to an example employing SOI made by SIMOX technology. The thickness of the silicon layer 3 should be of high uniformity (suitable SIMOX wafers are available from Ibis, USA).

Once the SOI material has been selected, the silicon nitride mask layer 1 can be prepared as shown in FIG. 1A. The silicon nitride layer 1 is deposited on top of the thin silicon oxide layer 2. The mask window is formed in the silicon nitride layer 1 by means of lithography and plasmochemical etching, the silicon oxide layer 2 acting as a stop layer for the plasmochemical etching. The thin oxide layer 2 within the window area is then removed by wet chemical etching, forming a pendant edge around the periphery of the mask window. The mask layer is sufficiently thick to prevent the formation of any wave-like relief on the surface of the silicon layer 3 outwith the mask window area. The formation of a pendant edge around the mask window is advantageous in obtaining a uniform WOS surrounded by a flat silicon surface around the edge of the mask window.

The silicon layer 6 is grounded (earthed) as indicated at 11 in FIG. 1A during the sputtering process so as to prevent charge damage to the array 7 formed by the sputtering process.

The mask window is preferably oriented relative to the direction of the ion beam as indicated in FIGS. 1A, 1B and 2, such that the ion incidence plane defined by the surface normal and the ion flow direction is oriented parallel to the longer sides of the rectangular mask window. This maximises the advantageous effect of the pendant edge of the mask window.

The mask thickness may be selected such that the mask material is removed by the sputtering process, the mask material and the silicon surface within the mask window being sputtered at approximately equal rates.

The sputtering process is carried out on the basis of the parameters E, θ and T which have previously been determined. Sputtering may be carried out in the ultra-high vacuum chamber of surface analysis apparatus (e.g. type PHI 660 from Perkin Elmer, USA). During sputtering, a secondary ion emission signal from the insulator layer 4 of the SOI material is monitored, and sputtering is terminated when this signal exceeds a predetermined threshold value, indicating that the troughs of the WOS are approaching the silicon-insulator border. As shown in FIG. 1C, the threshold value, S, can suitably be defined as the value at which the signal exceeds the average background value B by an amount equal to the peak-to-peak height of the noise signal N (i.e. S=B+N).

A low energy electron gun (not shown) may be used to compensate for ion charging, by electron irradiation of the sputtered area (as is known in the field of depth profiling of insulators).

These steps result in the formation of the quantum wire array 7 within the area of the mask window. FIG. 1D illustrates the internal structure of the array 7 when fabricated at room temperature, as described above. When fabricated at 850 K, the internal structure of the array 7 differs from that obtained at room temperature. When prepared at 850 K, the present inventors have discovered that the wavelength of the WOS is reduced by a factor of 3.3, as compared with the wavelength obtained with similar process parameters at room temperature. However, the thicknesses of the layers and the slopes of the sides of the waves remain the same as at room temperature. The structure obtained at 850 K does not contain the crystalline silicon regions 12. The horizontal dimension of the regions of amorphous silicon nitride 8 is shortened by a factor of 3.3 compared with those formed under room temperature conditions, and the regions of silicon oxynitride 10 are not separated. In this case, the regions 9 can be considered as quantum wires after annealing, as described below, isolated from one another by the regions 8.

Following completion of the sputtering process, the product is annealed in an inert environment, suitably at a temperature of 1000° C. to 1200° C. for a period of at least one hour, followed by high-temperature oxidation. The annealing process results in the regions of mixture of amorphous silicon and silicon nitride inclusions 9 being effectively depleted of nitrogen, resulting in the formation of clear cut nitride borders around the regions 9. In addition, the regions 9 are converted into crystalline silicon. The high-temperature oxidation step may be similar to oxidation processes employed in the fabrication of gate oxide layers as is well known in the field of semiconductor fabrication.

From the foregoing, it will be seen that the silicon quantum wires of the array obtained by means of the present invention can be formed in one of three basic ways. Firstly, when sputtered at room temperature, the sputtered structure contains regions 12 of crystalline silicon which can be regarded as quantum wires, isolated from one another by regions 8. Secondly, if the structure sputtered at room temperature is subsequently annealed, the regions 9 are converted to crystalline silicon and may also be regarded as quantum wires. In this case, the regions 12 also increase in volume, merging with the regions 9, the quantum wires again being mutually isolated by the regions 8. Thirdly, if the array is sputtered at 850 K, the sputtered structure does not contain any crystalline silicon regions 12, subsequent annealing converting the regions 9 to crystalline silicon and thereby forming the quantum wires of the array, isolated from one another by the regions 8.

Annealing also expands the lowermost corner portions of the regions 8, improving the isolation of the regions 9 in all of the cases described above.

From the foregoing description, it will be understood that quantum wire arrays with a wavelength in the range of about 30 to 120 nm can be formed by sputtering at room temperature, and shorter wavelengths down to about 9 nm can be obtained by increasing the temperature of the material during sputtering above about 550 K, with minimum wavelengths being obtained at about 850 K. Depending on the process parameters, the WOS obtained by sputtering may include regions 12 of crystalline silicon, which may provide useful, mutually isolated quantum wires. Where the sputtered structure does not itself include such regions 12, quantum wires are formed in the regions 9 by subsequent annealing of the sputtered product, such annealing being preferred whether or not the sputtered product includes the regions 12.

Figures 2A, 2B, 2C, 2D:
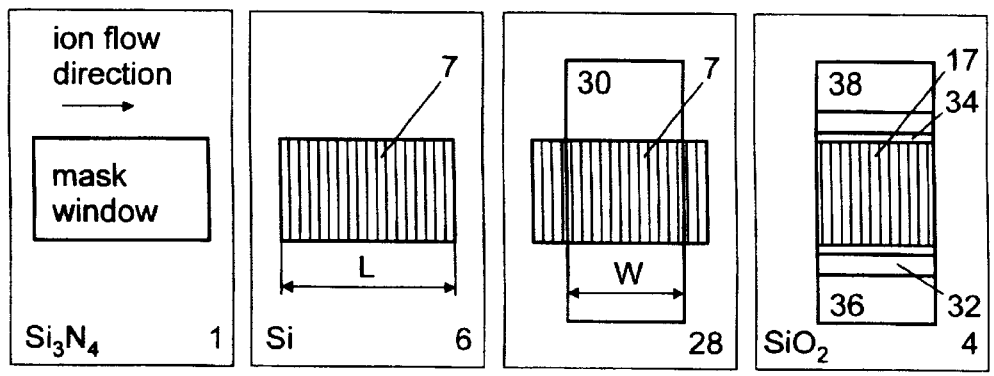
FIGS. 2A to 2D are schematic plan views of an SOI structure illustrating the formation of a FET device in accordance with the present invention.
Figure 3:
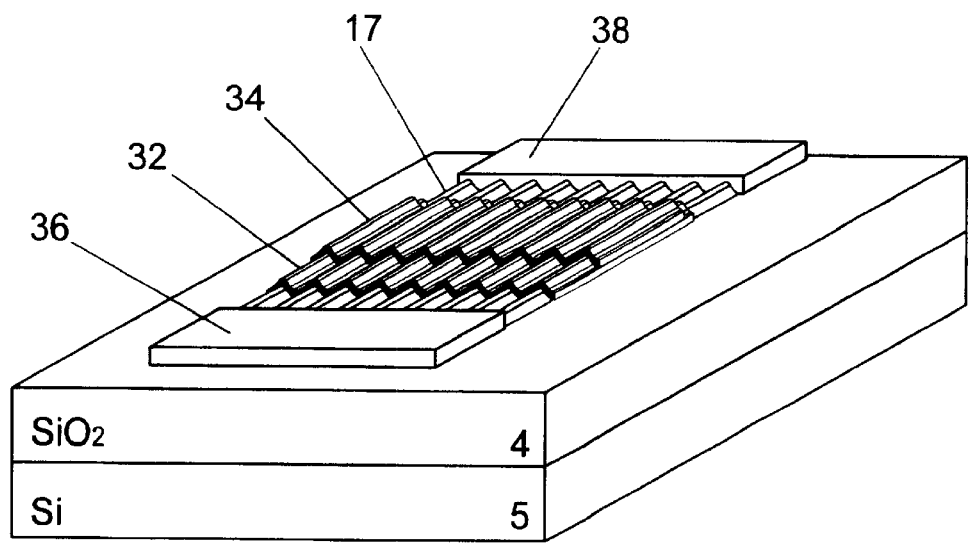
FIG. 3 is a schematic perspective view illustrating the structure of a FET with channels in the form of a silicon nanostructure array formed in accordance with the present invention.

FIGS. 2 and 3 illustrate the process of fabricating a device (an FET in this example) incorporating the quantum wire array 7 formed by the process described thus far. FIG. 2A illustrates the mask layer 1 defining the mask window on the SOI material prior to sputtering as previously described. FIG. 2B shows the quantum wire array 7 formed in the silicon layer 6, also as previously described.

FIG. 2C illustrates a first step in forming a FET incorporating the quantum wire array 7. The previously described high-temperature oxidising step forms a thin insulating layer 28 on the surface of the sputtered product. Using known lithography techniques, a polysilicon rectangle 30 is deposited on top of the insulator layer, extending across the width of the array 7. The length L of the array 7 may be greater than the width W of the polysilicon area 30. The area surrounding the polysilicon 30 can then be etched back to SOI insulator layer 4, leaving. Then, by means of lithography, the ends of the polysilicon area 30 are etched to leave silicon pads 36 and 38 at either end of the array 7 and to metallize the pads 36 and 38, as seen in FIG. 2D, where numeral 17 indicates array 7 after etching, reduced in length from L to W.

It will be understood that, following the fabrication of the quantum wire array, devices may be fabricated incorporating the array by means of any of a variety of conventional semiconductor manufacturing technologies.

FIGS. 2D and 3 illustrate the FET device formed as described above. In FIGS. 2D and 3, numeral 32 indicates the oxide insulator layer and 34 indicates the polysilicon layer remaining after etching of the corresponding layers 28 and 30 of FIG. 2C. In FIG. 3 the layers 32 and 34 are shown partially removed to reveal the underlying quantum wire array 7, for the purposes of illustration only. In FIG. 2D, the layers 32 and 34 can be seen to extend to the pads 36 and 38.

The invention allows devices of this type to be made having dimensions smaller than has hitherto been possible and/or with improved repeatability of results and quality of end product.

The invention has been described thus far with particular reference to the formation of quantum wire arrays based on wave ordered structures formed by sputtering. However, the WOS formed by the basic sputtering process may also be used as a mask for ion implantation (e.g. low energy implantation of phosphorous ions) into silicon for quantum computer applications. Ion implantation is the principal technique for introducing dopant atoms into semiconductor materials for VLSI applications. Mask layers with windows are normally used for the formation of two-dimensional dopant distributions. Ion implantation is usually followed by annealing for electrical activation of the dopants and for the restoration of the crystal structure of the semiconductor. For example, if a WOS as illustrated in FIG. 1D is formed, then after high temperature annealing the regions 8 may serve as a mask allowing selective ion implantation into the right hand side of the regions 9 (the direction of low-energy ion flow being normal to the surface of the material). Such an ion implantation process would result in a pattern of alternating doped stripes having the same period as the WOS. Using a WOS period of about 10 nm or less, the phosphorous doped stripes formed in this way are sufficiently close to allow interactions of the type required for quantum computer applications. Ion implantation might also be employed as an alternative method of forming quantum wire arrays using the WOS as a mask.

Improvements and modifications may be incorporated without departing from the scope of the invention as defined in the claims appended hereto.

What is claimed is:

1. A method of forming a silicon nanostructure, comprising:

sputtering a silicon surface having a predetermined temperature by a uniform flow of nitrogen molecular ions having a predetermined ion energy, a predetermined ion incidence angle, and a predetermined ion penetration range, in an ultra-high vacuum so as to form a periodic wave-ordered-structure having a formation depth and a height and defining a wave front of said periodic wave-ordered-structure in the direction of an ion incidence plane defined by said flow of nitrogen molecular ions; further including the following steps:

prior to sputtering:
(a) selecting a desired wavelength of the periodic wave-ordered-structure in the range 9 nm to 120 nm; and
(b) determining the ion energy, the ion incidence angle to said silicon surface, the temperature of said silicon, the formation depth of said wave-ordered-structure, the height of said wave-ordered-structure and the ion penetration range into silicon, all on the basis of said selected wavelength.

2. A method as claimed in claim 1, wherein said ion energy, said ion incidence angle, said temperature of said silicon, said formation depth and said height of said wave-ordered-structure are determined on the basis of previously obtained empirical data relating said ion energy, said ion incidence angle, said temperature of said silicon, said formation depth and said height of said wave-ordered-structure to the wavelength of said periodic wave-ordered-structure, and wherein said ion penetration range is determined from said ion energy.

3. A method as claimed in claim 1, further including the step, prior to sputtering, of positioning a silicon nitride mask containing a window with pendant edges on said silicon surface and sputtering said silicon surface through said window.

4. A method as claimed in claim 1, further including the step, prior to sputtering, of removing any impurities from said silicon surface.

5. A method as claimed in claim 1, further including, subsequent to sputtering:

annealing the silicon surface with said wave-ordered-structure in an inert environment.

6. A method as claimed in claim 5, wherein the silicon surface is annealed at a temperature between 1000 and 1200° C. for a period of at least one hour.

7. A method as claimed in claim 1, wherein said silicon nanostructure comprises a silicon quantum wire array and said silicon comprises a silicon layer of a silicon-on-insulator material, and further including:

selecting a thickness of said silicon layer to be greater than the sum of said formation depth of said wave-ordered-structure, said height of said wave-ordered-structure, and said ion penetration range.

8. A method as claimed in claim 7, further including:

during sputtering:
detecting a secondary ion emission signal from an insulator layer of said silicon-on-insulator material; and
terminating sputtering when the value of the detected signal reaches a predetermined threshold value.

9. A method as claimed in claim 8, wherein said threshold value of said secondary ion emission signal is that value at which the signal exceeds an average background value by an amount equal to a peak-to-peak height of a noise component of the signal.

* * * * *